United States Patent
Wang (10) Patent No.: US 10,958,222 B2
(45) Date of Patent: Mar. 23, 2021

(54) BIAS CIRCUIT

(71) Applicant: RichWave Technology Corp., Taipei (TW)

(72) Inventor: Yi-Fong Wang, Taipei (TW)

(73) Assignee: RichWave Technology Corp., Taipei (TW)

( * ) Notice: Subject to any disclaimer, the term of this patent is extended or adjusted under 35 U.S.C. 154(b) by 21 days.

(21) Appl. No.: 16/439,726

(22) Filed: Jun. 13, 2019

(65) Prior Publication Data

US 2019/0386620 A1   Dec. 19, 2019

Related U.S. Application Data (60) Provisional application No. 62/685,288, filed on Jun. 15, 2018.

(51) Int. Cl.
| | | |
|---|---|---|
| H03F 3/04 | (2006.01) | |
| H03F 1/30 | (2006.01) | |
| H03F 3/20 | (2006.01) | |
| H03F 1/32 | (2006.01) | |

(52) U.S. Cl.
CPC .......... *H03F 1/30* (2013.01); *H03F 1/32* (2013.01); *H03F 3/20* (2013.01); *H03F 2200/451* (2013.01)

(58) Field of Classification Search
CPC ......... H03F 1/30; H03F 3/04; H03F 2200/481
USPC ........................................ 330/285, 290, 296
See application file for complete search history.

(56) References Cited

U.S. PATENT DOCUMENTS

| | | | |
|---|---|---|---|
| 6,333,677 B1 | 12/2001 | Dening | |
| 7,768,345 B2 | 8/2010 | Aoki | |
| 9,571,139 B2 | 2/2017 | Alon | |
| 9,768,738 B2 | 9/2017 | Honda | |
| 10,277,173 B1 | 4/2019 | Hur | |
| 10,284,150 B2 | 5/2019 | Watanabe | |
| 2003/0201835 A1* | 10/2003 | Dening | H03F 3/19 330/298 |
| 2007/0052481 A1* | 3/2007 | Newman | H03F 1/52 330/298 |
| 2008/0238553 A1 | 10/2008 | Cho | |
| 2014/0285268 A1 | 9/2014 | Tsutsui | |
| 2016/0197586 A1 | 7/2016 | Ripley | |

(Continued)

FOREIGN PATENT DOCUMENTS

| CN | 1613178 A | 5/2005 |
|---|---|---|
| CN | 1633746 A | 6/2005 |

(Continued)

OTHER PUBLICATIONS

Wang, the specification, including the claims, and drawings in the U.S. Appl. No. 16/691,497, filed Nov. 21, 2019.

*Primary Examiner* — Steven J Mottola
(74) *Attorney, Agent, or Firm* — Winston Hsu (57) ABSTRACT

A bias circuit includes a current sensor, a transistor, and a low pass filter circuit. The current sensor has a first terminal coupled to a voltage terminal, and a second terminal. The transistor has a first terminal coupled to the second terminal of the current sensor, a second terminal coupled to a radio frequency signal path for providing a bias signal, and a control terminal for receiving a reference voltage. The low pass filter circuit is coupled between the second terminal of the current sensor and the control terminal of the transistor.

18 Claims, 9 Drawing Sheets

(56) References Cited

U.S. PATENT DOCUMENTS

2016/0344357 A1 11/2016 Ho
2019/0089307 A1 3/2019 Tanaka
2020/0099339 A1 3/2020 Chen

FOREIGN PATENT DOCUMENTS

| CN | 102006015 B | 11/2012 |
| CN | 101997495 B | 11/2013 |
| CN | 106797204 A | 5/2017 |
| TW | I261413 | 9/2006 |

* cited by examiner

BIAS CIRCUIT

CROSS REFERENCE TO RELATED APPLICATION

This non-provisional application claims priority of U.S. provisional application No. 62/685,288, filed on Jun. 15, 2018, included herein by reference in its entirety.

TECHNICAL FIELD

The present invention is related to a bias circuit, and more particularly, to a bias circuit having a feedback path for reducing the variation of the bias signal.

BACKGROUND

Amplifiers are usually used to amplify signals to improve signal quality for both signal transmission and signal reception in wireless communications.

However, since the environment in which wireless communications is located may change at any moment, the power of the radio frequency (RF) signal may also change correspondingly. When the instantaneous power of a modulated RF signal on an RF signal path exceeds a specific power level, a bias signal provided by a bias circuit for RF signal path will also vary, thereby reducing the stability of the bias signal and degrading the performance and the linearity of an amplifier disposed on the RF signal path.

Furthermore, the temperature change of the amplifier due to self-heating can also affect the stability of the bias signal, affecting the performance of the amplifier, and even causing damages to the amplifier and/or thermal runaway of the transistors in the amplifier. Since the bias circuit plays such a crucial role in achieving the linearity and performance of the amplifier, the design of the bias circuit has also raised interests.

SUMMARY

One embodiment of the present invention discloses a bias circuit. The bias circuit includes a current sensor, a transistor, and a low pass filter circuit.

The current sensor has a first terminal coupled to a voltage terminal, and a second terminal. The transistor has a first terminal coupled to the second terminal of the current sensor, a second terminal coupled to a radio frequency (RF) signal path for providing a bias signal, and a control terminal for receiving a reference voltage. The low pass filter circuit is coupled between the second terminal of the current sensor and the control terminal of the transistor.

DETAILED DESCRIPTION

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

Figure 1:
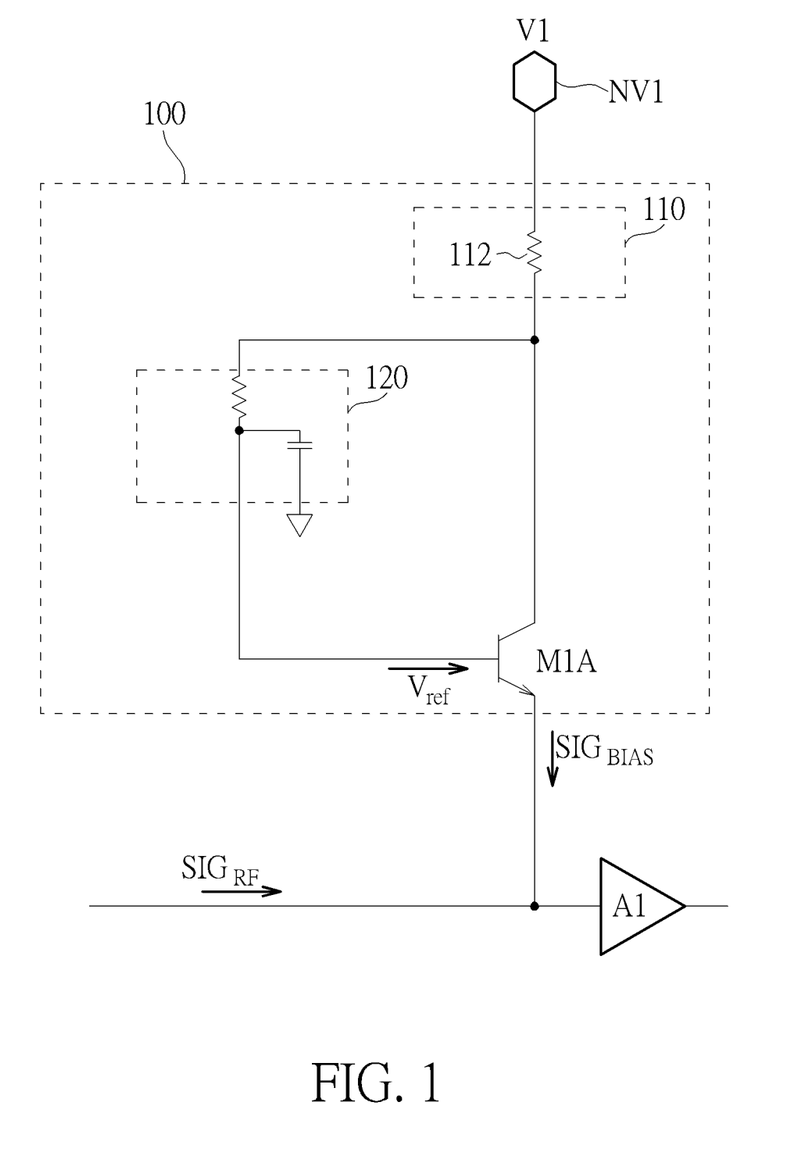
FIG. 1 shows a bias circuit according to one embodiment of the present invention.

FIG. 1 shows a bias circuit 100 according to one embodiment of the present invention. In some embodiments, the bias circuit 100 can be used to provide a bias signal $SIG_{BIAS}$ to a radio frequency (RF) signal path so that an amplifier A1 disposed on the RF signal path can be biased properly to amplify a RF signal $SIG_{RF}$. In some embodiments, the RF signal $SIG_{RF}$ can be an alternating current (AC) signal. Also, in some other embodiments, the bias circuit 100 may also be applied to other types of circuits for providing the bias signal $SIG_{BIAS}$ as required. The bias circuit 100 includes a current sensor 110, a transistor M1A, and a low pass filter circuit 120.

The current sensor 110 has a first terminal coupled to a voltage terminal NV1 for receiving a voltage V1, and a second terminal.

The transistor M1A has a first terminal coupled to the second terminal of the current sensor 110, a second terminal coupled to the RF signal path for providing the bias signal $SIG_{BIAS}$, and a control terminal for receiving a reference voltage $V_{ref}$. In some embodiments, the bias signal $SIG_{BIAS}$ can be a direct current (DC) voltage.

The low pass filter circuit 120 is coupled between the second terminal of the current sensor 110 and the control terminal of the transistor M1A. In FIG. 1, the low pass filter circuit 120 can be a resistor-capacitor (RC) filter; however, in some other embodiments, the low pass filter circuit 120 includes an inductor-capacitor (LC) filter and/or a RC filter.

In some embodiments, the current sensor 110 can adjust the voltage at the second terminal of the current sensor 110 according to the current flowing through the current sensor 110. For example, the current sensor 110 can include a current-voltage converter 112. In this case, when the current flowing through the current sensor 110 increases, the current sensor 110 will lower the voltage at the second terminal of the current sensor 110.

The voltage drop caused by the current sensor 110 can be transmitted to the control terminal of the transistor M1A through the low pass filter circuit 120 as a feedback signal. Consequently, the reference voltage $V_{ref}$ received by the control terminal of the transistor M1A will decrease, thereby suppressing the current that flows to the amplifier A1. Meanwhile, the RF signal $SIG_{RF}$ coupling to the second terminal of the current sensor 110 will be filtered out by the low pass filter circuit 120. That is, when the intensity of the RF signal $SIG_{RF}$ increases, the leakage of the RF signal $SIG_{RF}$ will also be increased, and the low pass filter circuit 120 can filter-out these interferences. Therefore, the bias signal $SIG_{BIAS}$ can be stabilized when the current drawn by the amplifier A1 increases due to the variation of the RF signal $SIG_{RF}$, and the performance and linearity of the amplification can be maintained. Also, in some embodiments, the RF signal $SIG_{RF}$ can be, for example, a modulated RF signal. In this case, when the instantaneous power of the modulated RF signal exceeds a specific power level, the current flowing through the transistor MIA may become too large, and the stable bias signal $SIG_{BIAS}$ can help to protect the transistor MIA from being damaged by the large current.

In FIG. 1, the current-voltage converter 112 can be implemented by a resistor; however, in some embodiments, the current-voltage converter 112 can be implemented by a resistor, a transistor and/or a diode. In some embodiments, the current-voltage converter 112 can be an on-chip component, and in some other embodiments, the current voltage-converter 112 can be an external component for easier adjustment.

Furthermore, in FIG. 1, the reference voltage $V_{ref}$ can be generated by the low pass filter circuit 120, however, in some other embodiments, the reference voltage $V_{ref}$ can be generated by a reference voltage generator, and the reference voltage $V_{ref}$ can be even more stable.

Figure 2:
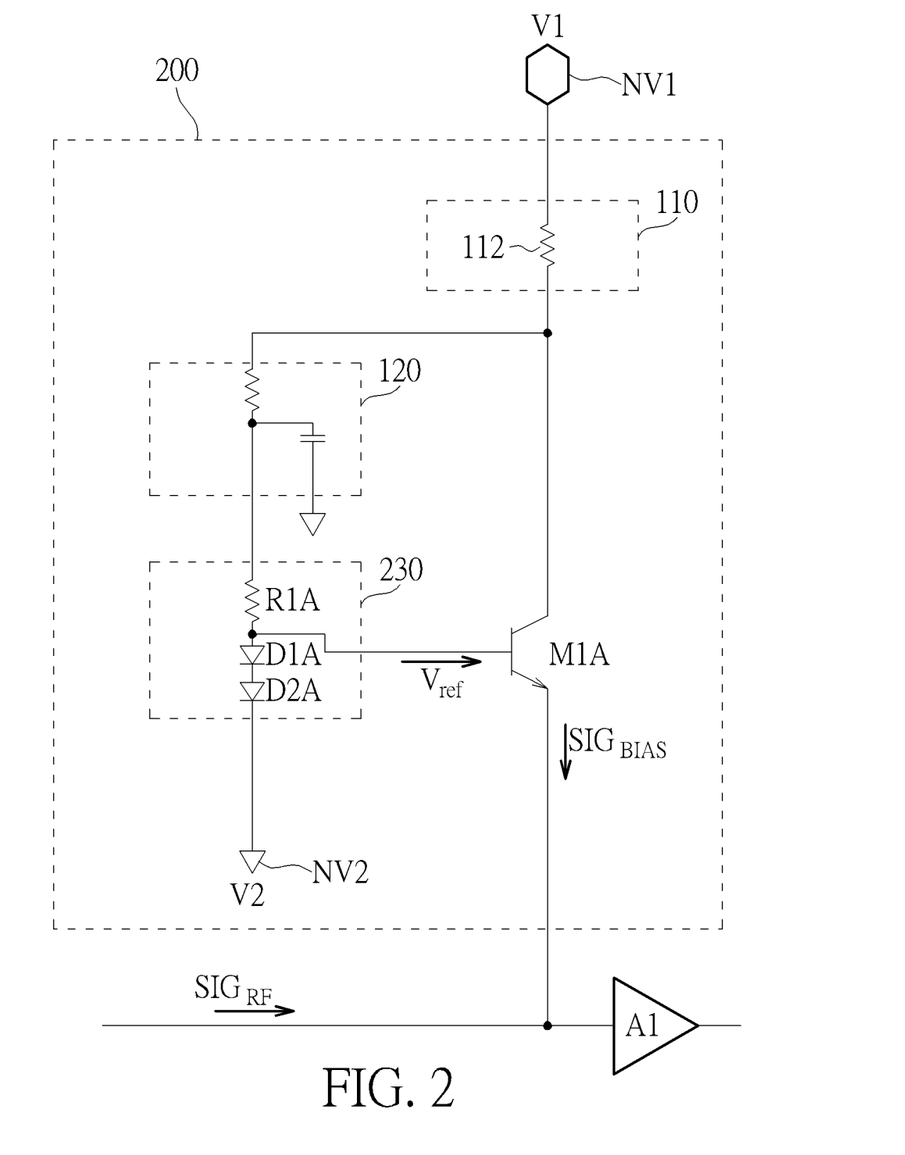
FIG. 2 shows a bias circuit according to another embodiment of the present invention.

FIG. 2 shows a bias circuit 200 according to another embodiment of the present invention. In FIG. 2, the bias circuit 200 can further include a reference voltage generator 230 to generate the reference voltage $V_{ref}$ so as to control the transistor MIA to output a more steady bias signal $SIG_{BIAS}$. The reference voltage generator 230 has a first terminal coupled to the low pass filter circuit 120, a second terminal coupled to a voltage terminal NV2 for receiving a voltage V2, and a third terminal coupled to the control terminal of the transistor M1A. In some embodiments, the voltage V1 is greater than the voltage V2. For example, the voltage V1 can be the operation voltage of the system, and the voltage V2 can be the system reference voltage or the ground voltage.

The reference voltage generator 230 can generate the reference voltage $V_{ref}$ through the third terminal of the reference voltage generator 230 according to voltages at a first terminal and a second terminal of the reference voltage generator 230.

In some embodiments, the reference voltage generator 230 includes a resistor R1A, and diodes D1A and D2A as shown in FIG. 2. The resistor R1A has a first terminal coupled to the first terminal of the reference voltage generator 230, and a second terminal coupled to the third terminal of the reference voltage generator 230. The diode D1A has a first terminal coupled to the second terminal of the resistor R1A, and a second terminal. The diode D2A has a first terminal coupled to the second terminal of the diode D1A, and a second terminal coupled to the second terminal of the reference voltage generator 230. In some embodiments, the diodes D1A and D2A can be implemented by diode-connected transistors. The first terminals of the diodes D1A and D2A can be anodes. The second terminals of the diodes D1A and D2A can be cathodes.

Figure 3:
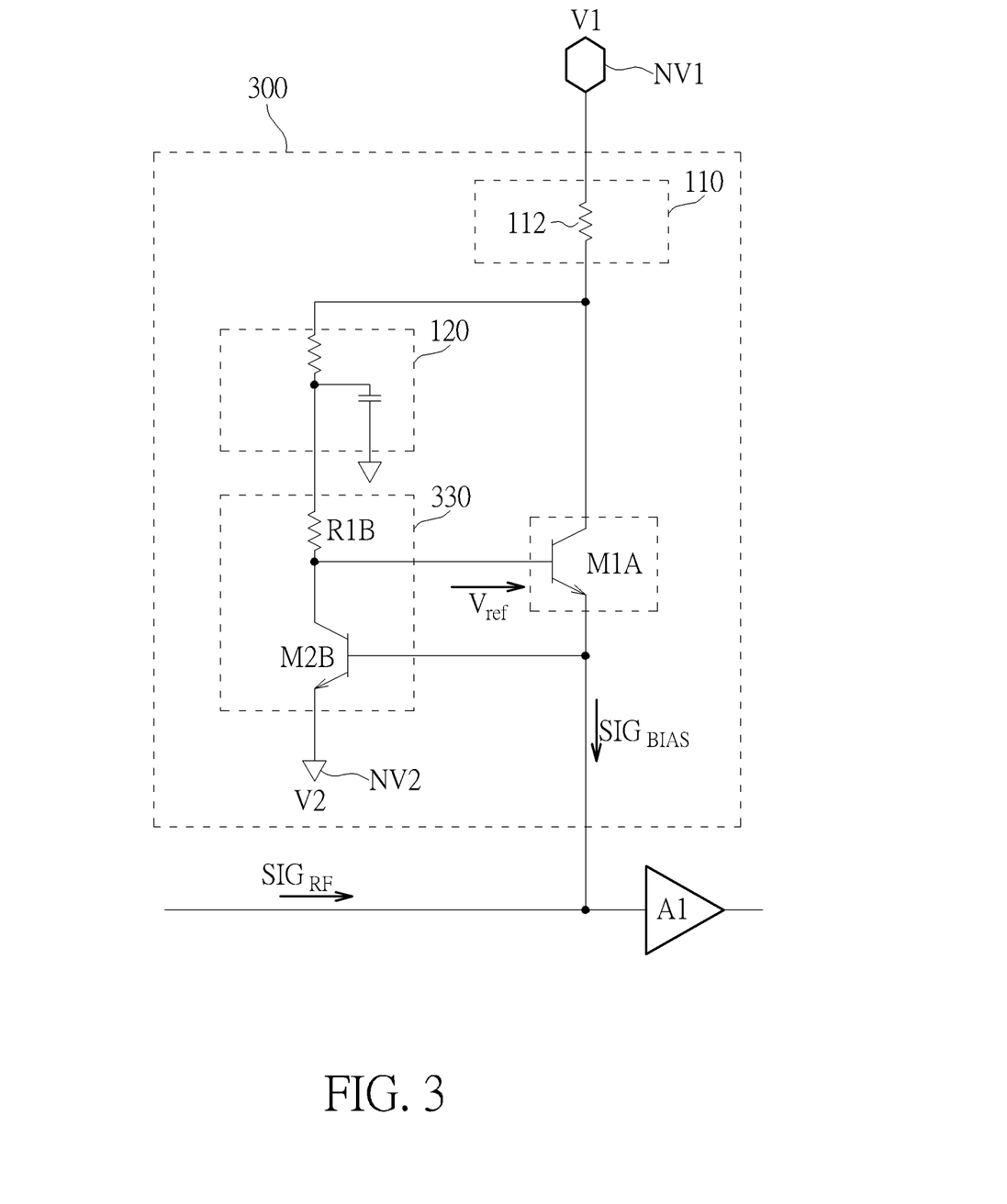
FIG. 3 shows a bias circuit according to another embodiment of the present invention.

FIG. 3 shows a bias circuit 300 according to another embodiment of the present invention. The bias circuits 200 and 300 have similar structures and can be operated with similar principles. However, the reference voltage generator 330 includes a resistor R1B and a transistor M2B.

The resistor R1B has a first terminal coupled to the first terminal of the reference voltage generator 330, and a second terminal coupled to the third terminal of the reference voltage generator 330. The transistor M2B has a first terminal coupled to the second terminal of the resistor R1B, a second terminal coupled to the second terminal of the reference voltage generator 330, and a control terminal coupled to the second terminal of the transistor M1A. With the structures shown in FIGS. 2 and 3, the reference voltage generators 230 and 330 can generate the reference voltage $V_{ref}$ even more stably.

Figure 4:
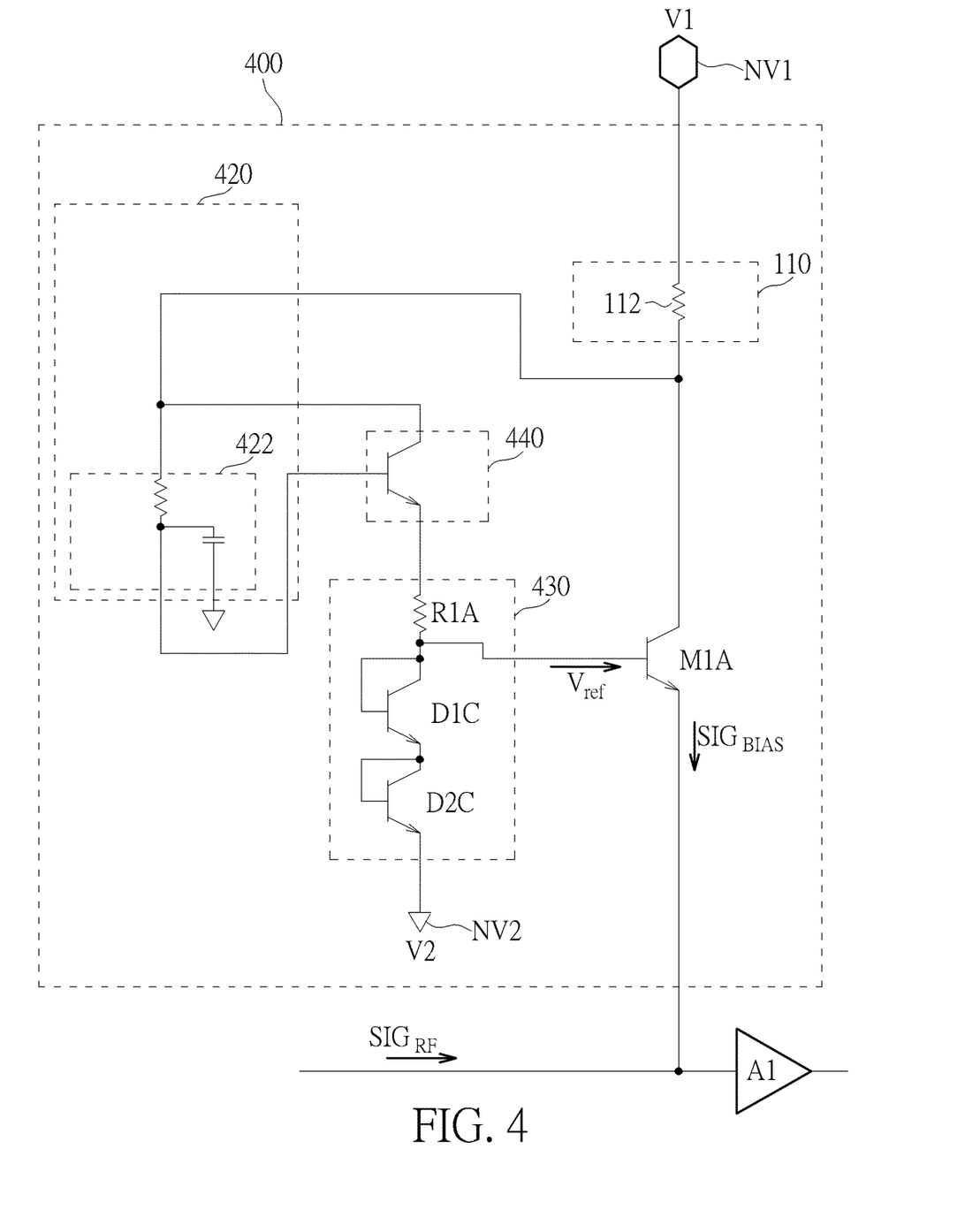
FIG. 4 shows a bias circuit according to another embodiment of the present invention.

FIG. 4 shows a bias circuit 400 according to another embodiment of the present invention. The bias circuits 200 and 400 have similar structures and can be operated with similar principles. However, the bias circuit 400 further includes a voltage follower 440.

In FIG. 4, the reference voltage generator 430 can have the similar structure as the reference voltage generator 230; however, the diode D1C and D2C in the reference voltage generator 430 can be implemented by diode-connected transistors.

The voltage follower 440 has a first terminal, a second terminal coupled to the first terminal of the reference voltage generator 430, and a control terminal coupled to the low pass filter circuit 420. The voltage follower 440 can control the reference voltage generator 430 to generate the reference voltage $V_{ref}$ properly according to the power level of the RF signal $SIG_{RF}$. For example, when the average power of the RF signal $SIG_{RF}$ increases, the voltage of the second terminal of the voltage follower 440 may also be raised. Consequently, the reference voltage $V_{ref}$ generated by the reference voltage generator 430 will increase, and the bias signal $SIG_{BIAS}$ will also increase, thereby helping to maintain the linearity of amplifier A1.

In FIG. 4, the low pass filter circuit 420 includes a low pass filtering unit 422. The low pass filtering unit 422 has a first terminal coupled to the second terminal of the current sensor 110 and the first terminal of the voltage follower 440, and a second terminal coupled to the control terminal of the voltage follower 440. The low pass filtering unit 422 can include an LC filter and/or a RC filter.

Figure 5:
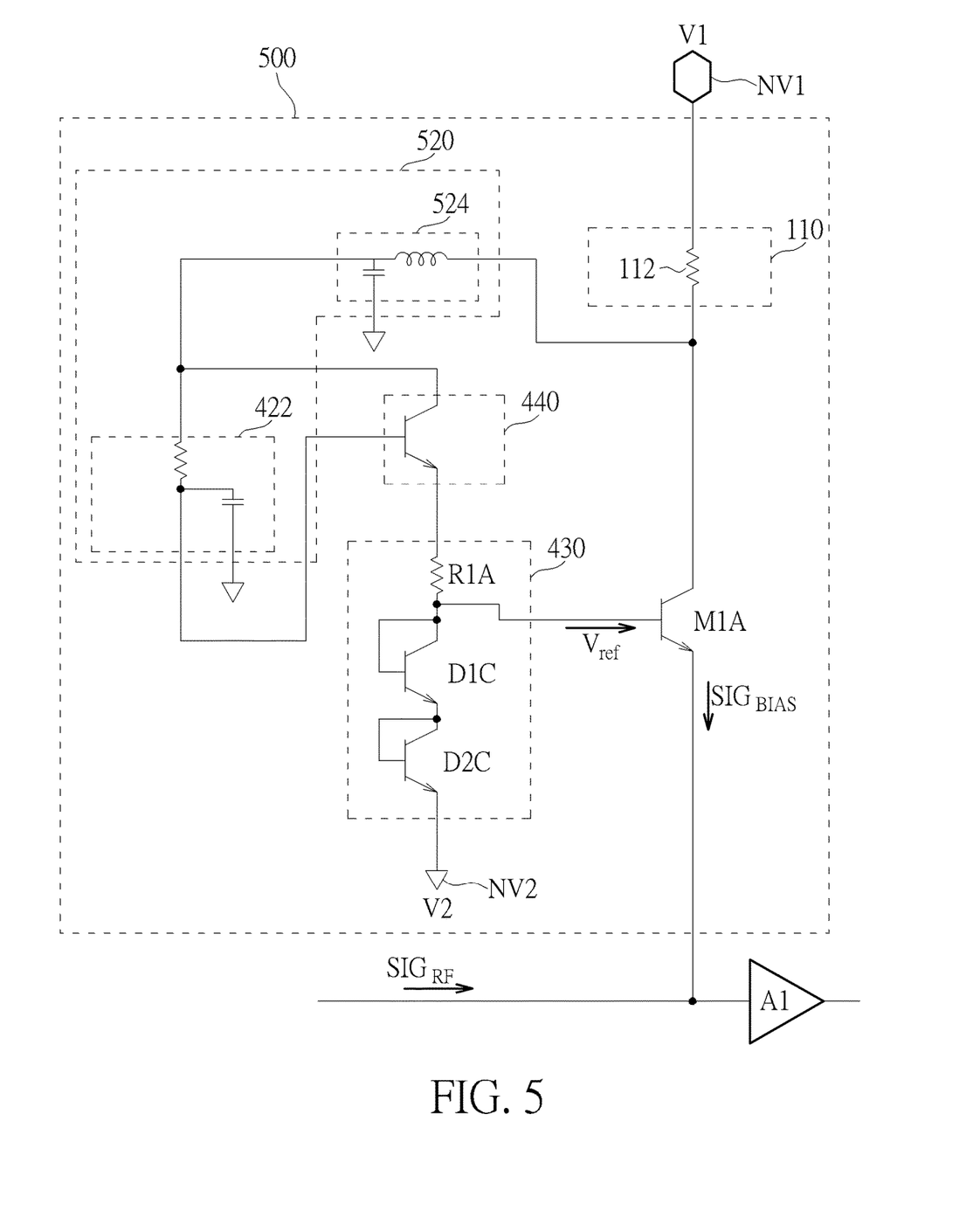
FIG. 5 shows a bias circuit according to another embodiment of the present invention.

FIG. 5 shows a bias circuit 500 according to another embodiment of the present invention. The bias circuits 400 and 500 have similar structures and can be operated with similar principles. However, the low pass filter circuit 520 of the bias circuit 500 further includes a low pass filtering unit 524. The low pass filtering unit 524 can include an LC filter and/or a RC filter.

In some embodiments, the low pass filtering unit 524 can further filter the high frequency noises and/or the RF signals $SIG_{RF}$ coupled to the second terminal of the current sensor 110. In addition, in some other embodiments, the low pass filtering unit 524 can also filter the second harmonic. The low pass filtering unit 524 has a first terminal coupled to the second terminal of the current sensor 110, and a second terminal coupled to the first terminal of the low pass filtering unit 422 and the first terminal of the voltage follower 440.

However, in some embodiments, if the operation condition permits, the low pass filtering unit 524 can be omitted as shown in FIG. 4.

In FIGS. 4 and 5, the voltage follower 440 can be an emitter follower; however, in some other embodiments, the voltage follower 440 can also be a source follower.

Figure 6:
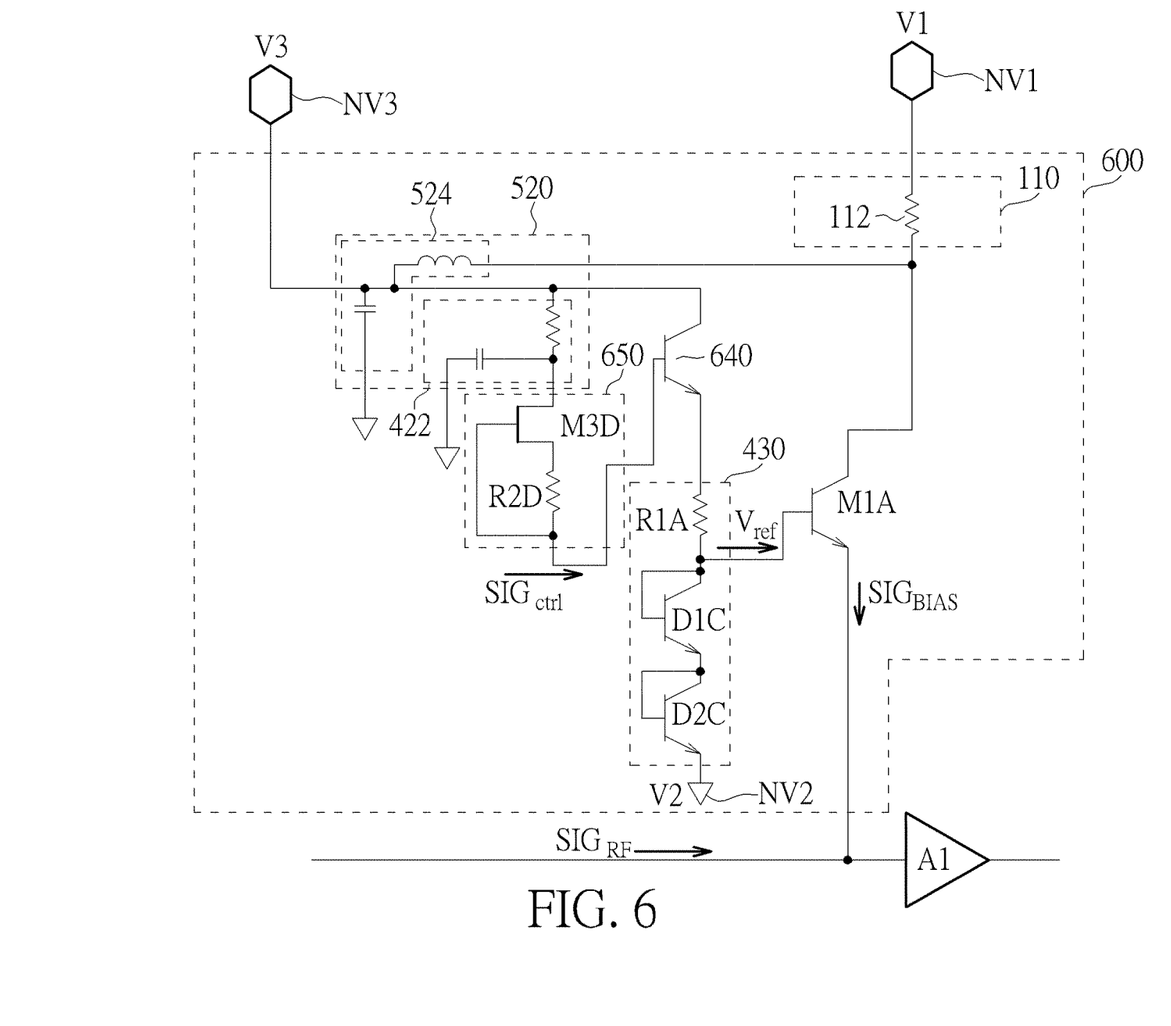
FIG. 6 shows a bias circuit according to another embodiment of the present invention.

FIG. 6 shows a bias circuit 600 according to another embodiment of the present invention. The bias circuits 500 and 600 have similar structures and can be operated with similar principles. However, the bias circuit 600 further includes a control signal generator 650. The control signal generator 650 can generate the control signal $SIG_{ctrl}$ for controlling the voltage follower 640.

The control signal generator 650 has a first terminal coupled to the low pass filter circuit 520, and a second terminal coupled to the control terminal of the voltage follower 640 and for outputting the control signal $SIG_{ctrl}$.

In FIG. 6, the voltage follower 640 can be an emitter follower implemented by a bipolar junction transistor (BJT), and the control signal $SIG_{ctrl}$ generated by the control signal generator 650 can be a current signal. For example, the control signal generator 650 can include a transistor M3D, and a resistor R2D.

The transistor M3D has a first terminal coupled to the first terminal of the control signal generator 650, a second terminal, and a control terminal. The resistor R2D has a first terminal coupled to the second terminal of the transistor M3D, and a second terminal coupled to the control terminal of the transistor M3D and the second terminal of the control signal generator 650. In some embodiments, the transistor M3D can be a field effect transistor (FET), for example but not limited to, a depletion mode (D-mode) FET. Also, in some embodiments, the transistor M3D can be manufactured with the process of GaAs.

Figure 7:
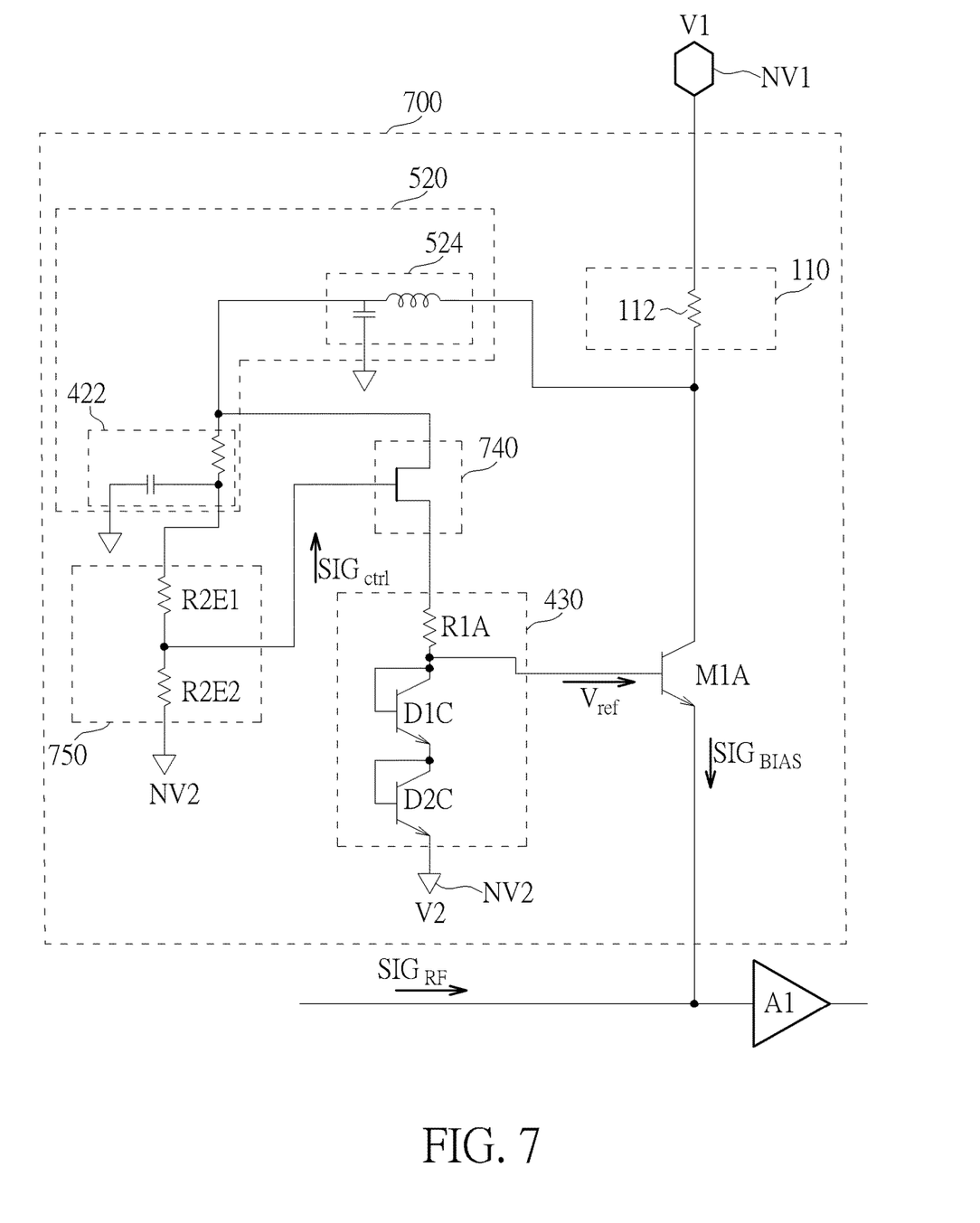
FIG. 7 shows a bias circuit according to another embodiment of the present invention.

FIG. 7 shows a bias circuit 700 according to another embodiment of the present invention. The bias circuits 600 and 700 have similar structures and can be operated with similar principles. However, the voltage follower 740 of the bias circuit 700 can be a source follower implemented by a FET, for example but not limited to, a D-mode FET, and in some embodiments, the FET can be manufactured with the process of GaAs. Also, the control signal $SIG_{ctrl}$ generated by a control signal generator 750 can be a voltage signal.

In this case, the control signal generator 750 includes resistors R2E1 and R2E2. The resistor R2E1 has a first terminal coupled to the first terminal of the control signal generator 750, and a second terminal coupled to the second terminal of the control signal generator 750. The resistor R2E2 has a first terminal coupled to the second terminal of the resistor R2E1, and a second terminal coupled to the voltage terminal NV2.

Figure 8:
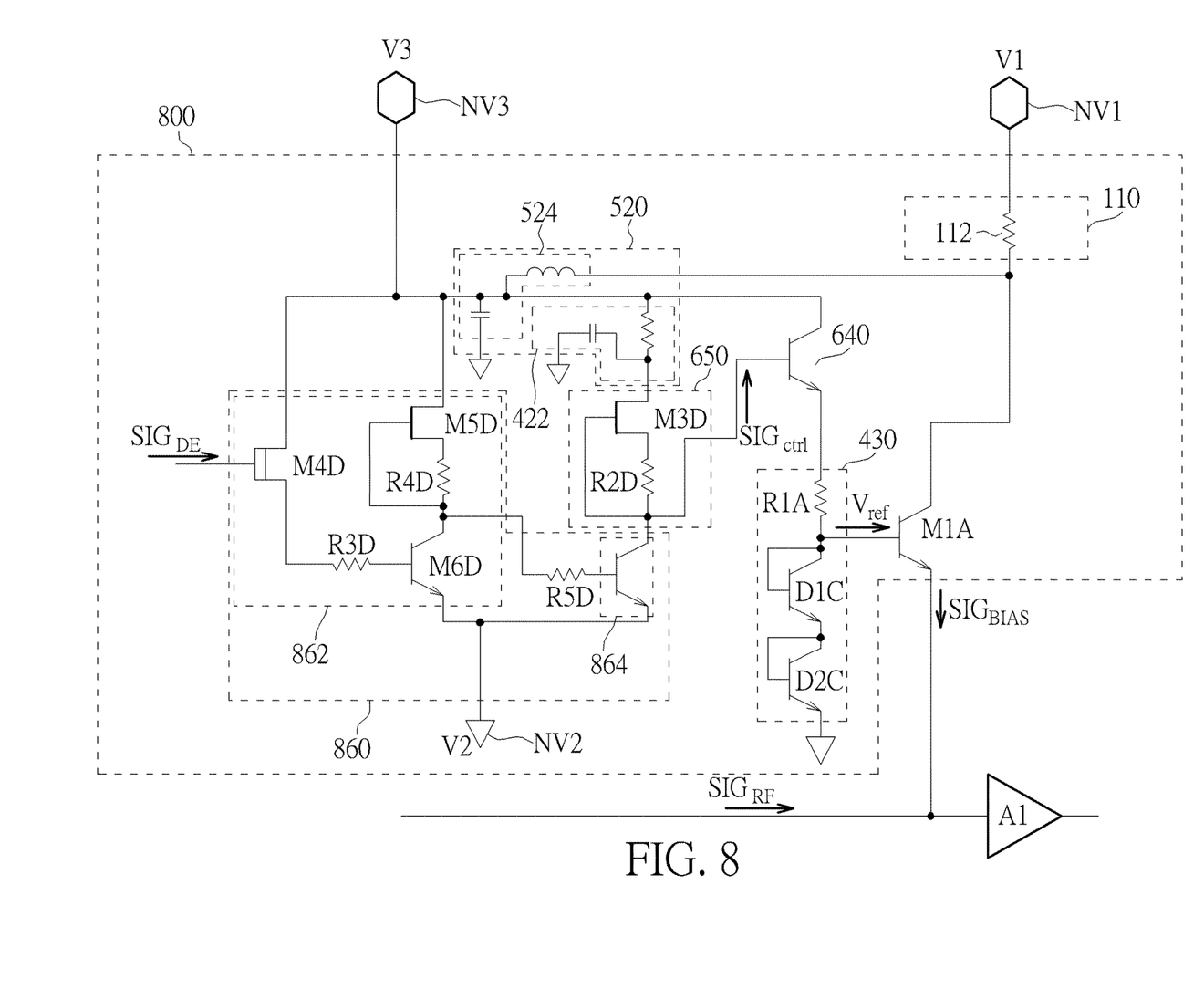
FIG. 8 shows a bias circuit according to another embodiment of the present invention.

FIG. 8 shows a bias circuit 800 according to another embodiment of the present invention. The bias circuits 600 and 800 have similar structures and can be operated with similar principles. However, the bias circuit 800 can further include a digital-enabled circuit 860. The digital-enabled circuit 860 and the control signal generator 650 can control the voltage follower 640 and the reference voltage generator 430.

In FIG. 8, the digital-enabled circuit 860 has a first terminal coupled to a voltage terminal NV3 for receiving a voltage V3, a second terminal coupled to the second terminal of the control signal generator 650, a third terminal coupled to the voltage terminal NV2, and a control terminal for receiving a digital enable signal $SIG_{DE}$. In some embodiments, the voltage V3 can be substantially the same as the voltage V1.

In FIG. 8, the digital-enabled circuit 860 can include an inverter 862. The inverter 862 includes an input terminal, an output terminal, transistors M4D, M5D, and M6D, and resistors R3D and R4D.

The input terminal of the inverter 862 is coupled to the control terminal of the digital-enable circuit 860 for receiving the digital enable signal $SIG_{DE}$. The transistor M4D has a first terminal coupled to the first terminal of the digital-enabled circuit 860, a second terminal, and a control terminal coupled to the input terminal of the inverter 862. In some embodiments, the transistor M4D can be a FET, for example, but not limited to an enhancement mode (E-mode) FET. Also, in some embodiments, the transistor M4D can be manufactured with the process of GaAs. The resistor R3D has a first terminal coupled to the second terminal of the fourth transistor M4D, and a second terminal.

The transistor M5D has a first terminal coupled to the first terminal of the transistor M4D, a second terminal, and a control terminal. In some embodiments, the transistor M5D can be a FET, for example, but not limited to a D-mode FET. Also, in some embodiments, the transistor M5D can be manufactured with the process of GaAs. The resistor R4D has a first terminal coupled to the second terminal of the transistor M5D, and a second terminal coupled to the control terminal of the transistor M5D. The transistor M6D has a first terminal coupled to the second terminal of the resistor R4D and the output terminal of the inverter 862, a second terminal coupled to the third terminal of the digital-enable circuit 860, and a control terminal coupled to the second terminal of the resistor R3D.

Also in FIG. 8, the digital-enabled circuit 860 further includes a resistor R5D, and a switch 864. The resistor R5D has a first terminal coupled to the output terminal of the inverter 862, and a second terminal. The switch 864 has a first terminal coupled to the second terminal of the digital-enabled circuit 860, a second terminal coupled to the third terminal of the digital-enable circuit 860, and a control terminal coupled to the second terminal of the resistor R5D. In some embodiments, the switch 864 can include a transistor.

In this case, when the digital enable signal $SIG_{DE}$ is at a high voltage level for enabling the control signal generator 650, the switch 864 will be turned off so the first terminal of the switch 864 will remain at a high voltage. Therefore, the control signal $SIG_{ctrl}$ can be delivered to the control terminal of the voltage follower 640 and turn on the voltage follower 640. Consequently, the reference voltage generator 430 can be enabled by the current flowing through the voltage follower 640 to generate the reference voltage $V_{ref}$. Contrarily, when the digital enable signal $SIG_{DE}$ is at a low voltage level for disabling the control signal generator 650, the switch 864 will be turned on, and the control signal $SIG_{ctrl}$ will be at the low voltage, thereby turning off the voltage follower 640. Therefore, the reference voltage generator 430 will be disabled, and will not generate the reference voltage $V_{ref}$.

In some embodiments, the digital-enabled circuit 860 allows the bias circuit 800 to be controlled by a digital signal, that is, the digital enable signal $SIG_{DE}$. Furthermore, since the digital enabled circuit 860 can control the current that flows through the voltage follower 640 according to the digital enable signal $SIG_{DE}$ so the reference voltage $V_{ref}$ generated by the reference voltage generator 430 can be adjusted according to the voltage at the second terminal of the current sensor 110 for compensating the variation of the RF signal $SIG_{RF}$. In some embodiments, the user can control the digital enable signal $SIG_{DE}$ to be at a high voltage level or a low voltage level according to the requirement so as to save the power consumption.

In FIGS. 1 to 8, the bias circuits 100 to 800 can be used to provide the bias signal $SIG_{BIAS}$ for the amplifier A1 disposed on the RF signal path; however, in some other embodiments, the bias circuits 100 to 800 can further be used to provide the bias signals for multiple amplifiers.

Figure 9:
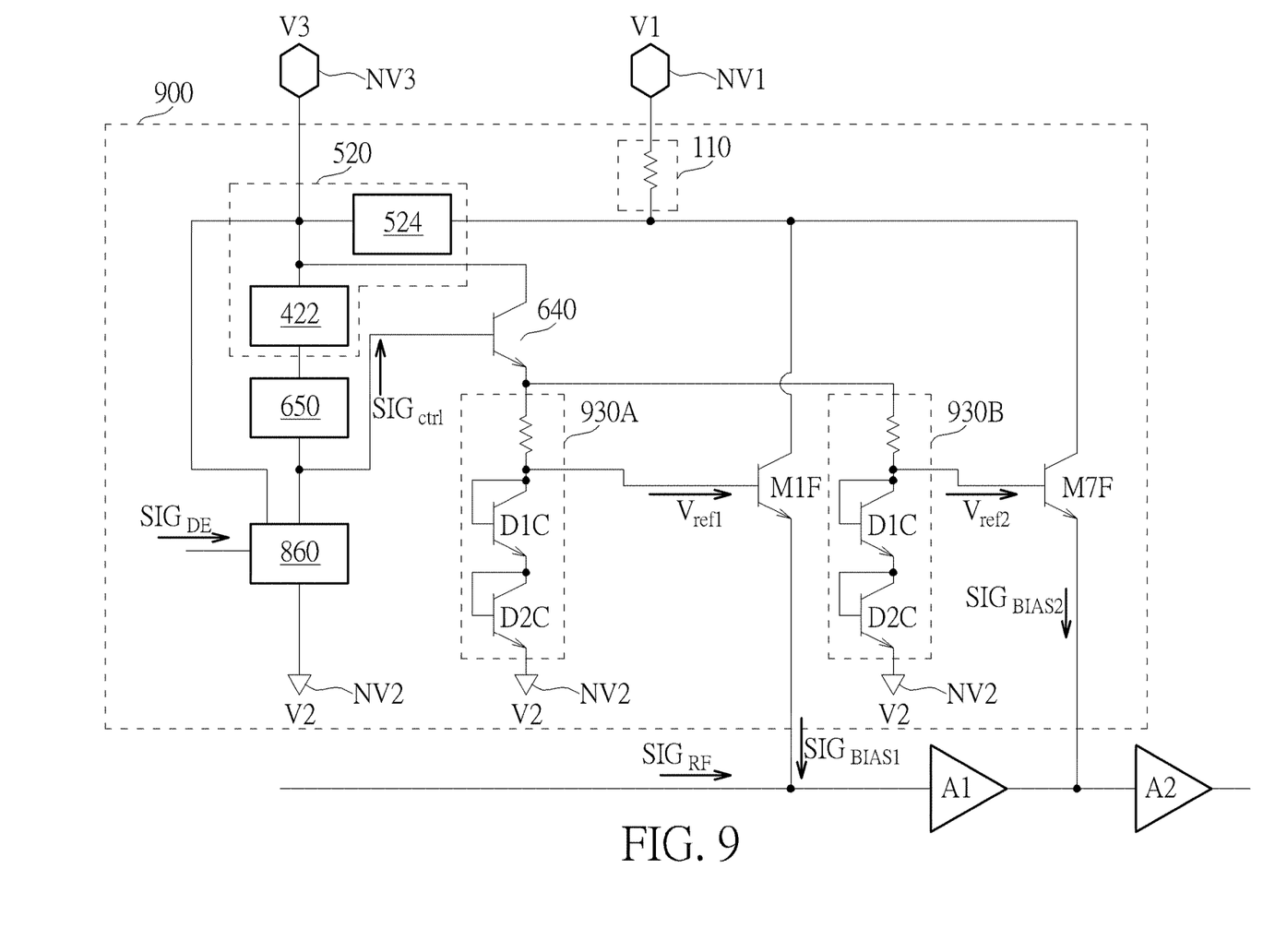
FIG. 9 shows a bias circuit according to another embodiment of the present invention.

FIG. 9 shows a bias circuit 900 according to another embodiment of the present invention. The bias circuits 900 and 800 have similar structures and can be operated with similar principles. However, in addition to the transistor M1F and the reference voltage generator 930A, the bias circuit 900 can further include a transistor M7F and a reference voltage generator 930B.

The transistor M1F has a first terminal coupled to the second terminal of the current sensor 110, a second terminal coupled to the amplifier A1 disposed on the RF signal path for providing the bias signal $SIG_{BIAS2}$, and a control terminal coupled to the low pass filter circuit 520 through the reference voltage generator 930A.

Also, the transistor M7F has a first terminal coupled to the second terminal of the current sensor 110, a second terminal coupled to the amplifier A2 disposed on the RF signal path for providing the bias signal $SIG_{BIAS2}$, and a control terminal coupled to the low pass filter circuit 520 through the reference voltage generator 930B.

The reference voltage generator 930A has a first terminal coupled to the low pass filter circuit 520, a second terminal coupled to the voltage terminal NV2, and a third terminal coupled to the control terminal of the transistor M1F. The reference voltage generator 930A can generate the reference voltage $V_{ref1}$ through the third terminal of the reference voltage generator 930A according to voltages at the first terminal and the second terminal of the reference voltage generator 930A.

The reference voltage generator 930B has a first terminal coupled to the low pass filter circuit 520, a second terminal coupled to the voltage terminal NV2, and a third terminal coupled to the control terminal of the transistor M7F. The reference voltage generator 930B can generate the reference voltage $V_{ref2}$ through the third terminal of the reference voltage generator 930B according to voltages at the first terminal and the second terminal of the reference voltage generator 930B.

In FIG. 9, the first terminal of the reference voltage generator 930A and the first terminal of the reference voltage generator 930B can be coupled to the low pass filer circuit 520 through the voltage follower 640; however, in some other embodiments, if the voltage follower 640 is omitted, then the first terminal of the reference voltage generator 930A and the first terminal of the reference voltage generator 930B may be coupled to the low pass filer circuit 520 directly.

In this case, whenever the RF signal $SIG_{RF}$ on the RF signal path varies at the input of the amplifier A1 or at the input of the amplifier A2, the bias circuit 900 will be able to adjust both of the bias signals $SIG_{BIAS1}$ and $SIG_{BIAS2}$ accordingly, thereby stabilizing the bias signals $SIG_{BIAS1}$ and $SIG_{BIAS2}$, and maintaining the performance and linearity of the amplifiers A1 and A2 even more efficiently. In some embodiments, the amplifiers A1 and/or A2 can be a power amplifier (PA).

Furthermore, in FIGS. 1 to 9, when the transistors M1A to M7F in the bias circuits 100 to 900 are BJTs, the first terminals of the transistors M1A to M7F can the collector terminals, the second terminals of the transistors M1A to M7F can be the emitter terminals, and the control terminals of the transistors M1A to M7F can be the base terminals. However, when the transistors M1A to M7F in the bias circuits 100 to 900 are FETs, the first terminals of the transistors M1A to M7F can be the drain terminals, the second terminals of the transistors M1A to M7F can be the source terminals, and the control terminals of the transistors M1A to M7F can be the gate terminals.

In summary, the bias circuits provided by the embodiments of the present invention can stabilize the bias signals according to the feedback signals transmitted from the current sensors and the low pass filter circuit. Therefore, the bias circuits can help to mitigate the issue of performance degradation caused by the self-heating and reduce the amplitude distortion (or AM-AM distortion) so as to maintain the performance and linearity of the amplifier.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A bias circuit comprising:
    a current sensor having a first terminal coupled to a first voltage terminal, and a second terminal;
    a first transistor having a first terminal coupled to the second terminal of the current sensor, a second terminal coupled to a radio frequency (RF) signal path for providing a first bias signal, and a control terminal configured to receive a reference voltage;
    a low pass filter circuit coupled between the second terminal of the current sensor and the control terminal of the first transistor; and
    a reference voltage generator having a first terminal coupled to the low pass filter circuit, a second terminal coupled to a second voltage terminal, and a third terminal coupled to the control terminal of the first transistor, and configured to generate the reference voltage through the third terminal of the reference voltage generator.

2. The bias circuit of claim 1, wherein the reference voltage generator comprises:
    a first resistor having a first terminal coupled to the first terminal of the reference voltage generator, and a second terminal coupled to the third terminal of the reference voltage generator;
    a first diode having a first terminal coupled to the second terminal of the first resistor, and a second terminal; and
    a second diode having a first terminal coupled to the second terminal of the first diode, and a second terminal coupled to the second terminal of the reference voltage generator.

3. The bias circuit of claim 1, wherein the reference voltage generator comprises:
    a first resistor having a first terminal coupled to the first terminal of the reference voltage generator, and a second terminal coupled to the third terminal of the reference voltage generator; and
    a second transistor having a first terminal coupled to the second terminal of the first resistor, a second terminal coupled to the second terminal of the reference voltage generator, and a control terminal coupled to the second terminal of the first transistor.

4. A bias circuit comprising:
    a current sensor having a first terminal coupled to a first voltage terminal, and a second terminal;
    a first transistor having a first terminal coupled to the second terminal of the current sensor, a second terminal coupled to a radio frequency (RF) signal path for providing a first bias signal, and a control terminal configured to receive a reference voltage;
    a low pass filter circuit coupled between the second terminal of the current sensor and the control terminal of the first transistor;
    a first reference voltage generator having a first terminal, a second terminal coupled to a second voltage terminal, and a third terminal coupled to the control terminal of the first transistor, and configured to generate the reference voltage through the third terminal of the first reference voltage generator; and a voltage follower having a first terminal, a second terminal coupled to the first terminal of the first reference voltage generator, and a control terminal coupled to the low pass filter circuit.

5. The bias circuit of claim 4, wherein the low pass filter circuit comprises:
a first low pass filtering unit having a first terminal coupled to the second terminal of the current sensor and the first terminal of the voltage follower, and a second terminal coupled to the control terminal of the voltage follower.

6. The bias circuit of claim 4, wherein the low pass filter circuit comprises:
a first low pass filtering unit having a first terminal coupled to the first terminal of the voltage follower, and a second terminal coupled to the control terminal of the voltage follower; and
a second low pass filtering unit having a first terminal coupled to the second terminal of the current sensor, and a second terminal coupled to the first terminal of the first low pass filtering unit and the first terminal of the voltage follower.

7. The bias circuit of claim 4, further comprising a control signal generator having a first terminal coupled to the low pass filter circuit, and a second terminal coupled to the control terminal of the voltage follower, and configured to generate a control signal to the voltage follower.

8. The bias circuit of claim 7, wherein the voltage follower is a source follower, and the control signal generated by the control signal generator is a voltage signal.

9. The bias circuit of claim 8, wherein the control signal generator comprises:
a second resistor having a first terminal coupled to the first terminal of the control signal generator, and a second terminal coupled to the second terminal of the control signal generator; and
a third resistor having a first terminal coupled to the second terminal of the second resistor, and a second terminal coupled to the second voltage terminal.

10. The bias circuit of claim 7, wherein the voltage follower is an emitter follower, and the control signal generated by the control signal generator is a current signal.

11. The bias circuit of claim 10, wherein the control signal generator comprises:
a third transistor having a first terminal coupled to the first terminal of the control signal generator, a second terminal, and a control terminal; and
a second resistor having a first terminal coupled to the second terminal of the third transistor, and a second terminal coupled to the control terminal of the third transistor and the second terminal of the control signal generator.

12. The bias circuit of claim 7, further comprising:
a digital-enabled circuit having a first terminal coupled to a third voltage terminal, a second terminal coupled to the second terminal of the control signal generator, a third terminal coupled to the second voltage terminal, and a control terminal configured to receive a digital enable signal.

13. The bias circuit of claim 12, wherein the digital-enabled circuit comprises an inverter.

14. The bias circuit of claim 13, wherein:
the inverter comprises:
an input terminal coupled to the control terminal of the digital-enable circuit;
an output terminal;
a fourth transistor having a first terminal coupled to the first terminal of the digital-enabled circuit, a second terminal, and a control terminal coupled to the input terminal of the inverter;
a fourth resistor having a first terminal coupled to the second terminal of the fourth transistor, and a second terminal;
a fifth transistor having a first terminal coupled to the first terminal of the fourth transistor, a second terminal, and a control terminal;
a fifth resistor having a first terminal coupled to the second terminal of the fifth transistor, and a second terminal coupled to the control terminal of the fifth transistor; and
a sixth transistor having a first terminal coupled to the second terminal of the fifth resistor and the output terminal of the inverter, a second terminal coupled to the third terminal of the digital-enable circuit, and a control terminal coupled to the second terminal of the fourth resistor;
wherein the digital-enabled circuit further comprising:
a sixth resistor having a first terminal coupled to the output terminal of the inverter, and a second terminal; and
a switch having a first terminal coupled to the second terminal of the digital-enabled circuit, a second terminal coupled to the third terminal of the digital-enable circuit, and a control terminal coupled to the second terminal of the sixth resistor.

15. The bias circuit of claim 1, wherein the current sensor comprises a current-voltage converter configured to lower a voltage at the second terminal of the current sensor as the current flowing through the current sensor increases.

16. The bias circuit of claim 1, wherein the second terminal of the first transistor is coupled to a first amplifier disposed on the RF signal path for providing the first bias signal.

17. The bias circuit of claim 16, further comprising:
a seventh transistor having a first terminal coupled to the second terminal of the current sensor, a second terminal coupled to a second amplifier disposed on the RF signal path for providing a second bias signal, and a control terminal.

18. The bias circuit of claim 17, further comprising:
a second reference voltage generator having a first terminal coupled to the low pass filter circuit, a second terminal coupled to the second voltage terminal, and a third terminal coupled to the control terminal of the seventh transistor.

* * * * *